(12) United States Patent
Loy et al.

(10) Patent No.: US 12,387,785 B2
(45) Date of Patent: Aug. 12, 2025

(54) STRUCTURES FOR THREE-TERMINAL MEMORY CELLS

(71) Applicant: GlobalFoundries Singapore Pte. Ltd., Singapore (SG)

(72) Inventors: Desmond Jia Jun Loy, Singapore (SG); Eng Huat Toh, Singapore (SG); Shyue Seng Tan, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 456 days.

(21) Appl. No.: 18/065,046

(22) Filed: Dec. 13, 2022

(65) Prior Publication Data

US 2024/0194255 A1    Jun. 13, 2024

(51) Int. Cl.
*G11C 13/00* (2006.01)
*H01L 23/522* (2006.01)
*H10B 99/00* (2023.01)
*H10D 64/23* (2025.01)

(52) U.S. Cl.
CPC ...... *G11C 13/0007* (2013.01); *H01L 23/5226* (2013.01); *H10B 99/00* (2023.02); *H10D 64/251* (2025.01); *G11C 2213/34* (2013.01); *G11C 2213/52* (2013.01)

(58) Field of Classification Search
CPC ..................................................... H10B 99/00
See application file for complete search history.

(56) References Cited

U.S. PATENT DOCUMENTS

| | | | |
|---|---|---|---|
| 9,564,587 B1* | 2/2017 | Jo | H10N 70/011 |
| 11,856,875 B2* | 12/2023 | Sun | H10N 70/823 |
| 2019/0214558 A1* | 7/2019 | Ando | G11C 13/003 |
| 2021/0399046 A1* | 12/2021 | Wu | H10D 30/6735 |
| 2024/0194714 A1* | 6/2024 | Zheng | H10F 39/807 |
| 2024/0231988 A1* | 7/2024 | Bourne | G06F 11/0772 |
| 2024/0297211 A1* | 9/2024 | Cai | H10D 64/66 |

OTHER PUBLICATIONS

K. Moon, et al. "RRAM-based synapse devices for neuromorphic systems" Faraday Discuss., 2019, 213, 421.
(Continued)

*Primary Examiner* — Mounir S Amer
(74) *Attorney, Agent, or Firm* — David Cain

(57) ABSTRACT

The disclosed subject matter relates generally to structures for use in memory devices. More particularly, the present disclosure relates to three terminal resistive random-access (ReRAM) memory structures having source, drain, and control electrodes. The present disclosure provides a memory structure including a source electrode, a drain electrode, a control electrode laterally between the source electrode and the drain electrode, a hole generating layer above the control electrode, a dielectric channel layer above the hole generating layer, the dielectric channel layer contacts the source electrode and the drain electrode, a first spacer layer on a first side of the control electrode, and a second spacer layer on a second side of the control electrode. The first spacer layer and the second spacer layer isolate the source electrode and the drain electrode from the control electrode and the hole generating layer.

20 Claims, 9 Drawing Sheets

(56) References Cited

OTHER PUBLICATIONS

J. Lee, et al. "Understanding of proton induced synaptic behaviors in three-terminal synapse device for neuromorphic systems", Nanotechnology 30 (2019) 255202 (6pp).
Y. Xi, et al. "Mechanism of Hydrogen Spillover on WO3(001) and Formation of HxWO3 (x=0.125, 0.25, 0.375, and 0.5)", J. Phys. Chem. C 2014, 118, 494-501.
E. Herrmann, A. Rush, T. Bailey and R. Jha, "Gate Controlled Three-Terminal Metal Oxide Memristor," in IEEE Electron Device Letters, vol. 39, No. 4, pp. 500-503, Apr. 2018, doi: 10.1109/LED.2018.2806188.

* cited by examiner

STRUCTURES FOR THREE-TERMINAL MEMORY CELLS

FIELD OF THE INVENTION

The disclosed subject matter relates generally to structures for use in memory devices. More particularly, the present disclosure relates to three terminal resistive random-access (ReRAM) memory structures having source, drain, and control electrodes.

BACKGROUND

Semiconductor devices and integrated circuit (IC) chips have found numerous applications in the fields of physics, chemistry, biology, computing, and memory devices. An example of a memory device is a non-volatile (NV) memory device. NV memory devices are programmable and have been extensively used in electronic products due to their ability to retain data for long periods, even after the power has been turned off. Exemplary categories for NV memory may include resistive random-access memory (ReRAM), erasable programmable read-only memory (EPROM), flash memory, ferroelectric random-access memory (FeRAM), and magnetoresistive random-access memory (MRAM).

A ReRAM device includes a switching layer that is positioned between a bottom electrode and a top electrode. The ReRAM device can be programmed by changing the resistance across the switching layer to provide different content-storage states, namely a high-resistance state (HRS) and a low-resistance state (LRS), representing the stored bits of data. The switching layer can be modified by applying a programming voltage sufficient to create one or more conductive filaments bridging across the thickness of the switching layer, which sets the low-resistance state. The conductive filaments may be formed, for example, by the diffusion of a conductive species (e.g., metal ions) from one or both of the electrodes into the switching layer. The conductive filaments can be destroyed, also by the application of a programming voltage, to reset the resistive memory element to the high-resistance state. The content-storage state can be read by measuring a voltage drop across the resistive memory element after it is programmed.

SUMMARY

In an aspect of the present disclosure, there is provided a memory structure including a source electrode, a drain electrode, a control electrode laterally between the source electrode and the drain electrode, the control electrode having a first side and a second side, a hole generating layer above the control electrode, a dielectric channel layer above the hole generating layer, the dielectric channel layer contacts the source electrode and the drain electrode, a first spacer layer on the first side of the control electrode, and a second spacer layer on the second side of the control electrode, in which the first spacer layer and the second spacer layer isolate the source electrode and the drain electrode from the control electrode and the hole generating layer.

In another aspect of the present disclosure, there is provided a memory structure including a source electrode having an upper surface, a drain electrode having an upper surface, a control electrode laterally between the source electrode and the drain electrode, the control electrode has a lower surface, a first side, and a second side, a hole generating layer on the control electrode, a dielectric channel layer on the hole generating layer, the dielectric channel layer having a first side and a second side, in which the first side contacts the source electrode and the second side contacts the drain electrode, a first spacer layer on the first side of the control electrode, a second spacer layer on the second side of the control electrode, in which the first spacer layer and the second spacer layer isolate the source electrode and the drain electrode from the control electrode and the hole generating layer, a first interconnect structure below and in direct contact with the lower surface of the control electrode, a second interconnect structure above and in direct contact with the upper surface of the source electrode, and a third interconnect structure above and in direct contact with the upper surface of the drain electrode.

In yet another aspect of the present disclosure, there is provided a memory structure including a first dielectric region, a first interconnect structure in the first dielectric region, a second dielectric region on the first dielectric region, a source electrode in the second dielectric region, a drain electrode in the second dielectric region, a control electrode in the second dielectric region, the control electrode is laterally between the source electrode and the drain electrode, the control electrode has a lower surface, a first side, and a second side, wherein the lower surface of the control electrode is on the first interconnect structure, a hole generating layer in the second dielectric region, the hole generating layer is on the control electrode, a dielectric channel layer in the second dielectric region, the dielectric channel layer is on the hole generating layer, the dielectric channel layer having a first side and a second side, wherein the first side contacts the source electrode and the second side contacts the drain electrode, a first spacer layer in the second dielectric region, the first spacer layer is on the first side of the control electrode, a second spacer layer in the second dielectric region, the second spacer layer is on the second side of the control electrode, wherein the first spacer layer and the second spacer layer isolate the source electrode and the drain electrode from the control electrode and the hole generating layer, a third dielectric region on the second dielectric region, a second interconnect structure in the third dielectric region, the second interconnect structure is on the source electrode, and a third interconnect structure in the third dielectric region, the third interconnect structure is on the drain electrode.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

FIG. 3 through FIG. 7 and FIG. 12 through FIG. 14 are cross-sectional views depicting structures at successive fabrication stages of a processing method for fabricating another exemplary memory structure shown in FIG. 2.

DETAILED DESCRIPTION

Various illustrative embodiments of the present disclosure are described below. The embodiments disclosed herein are exemplary and not intended to be exhaustive or limiting to the present disclosure.

Figure 1:
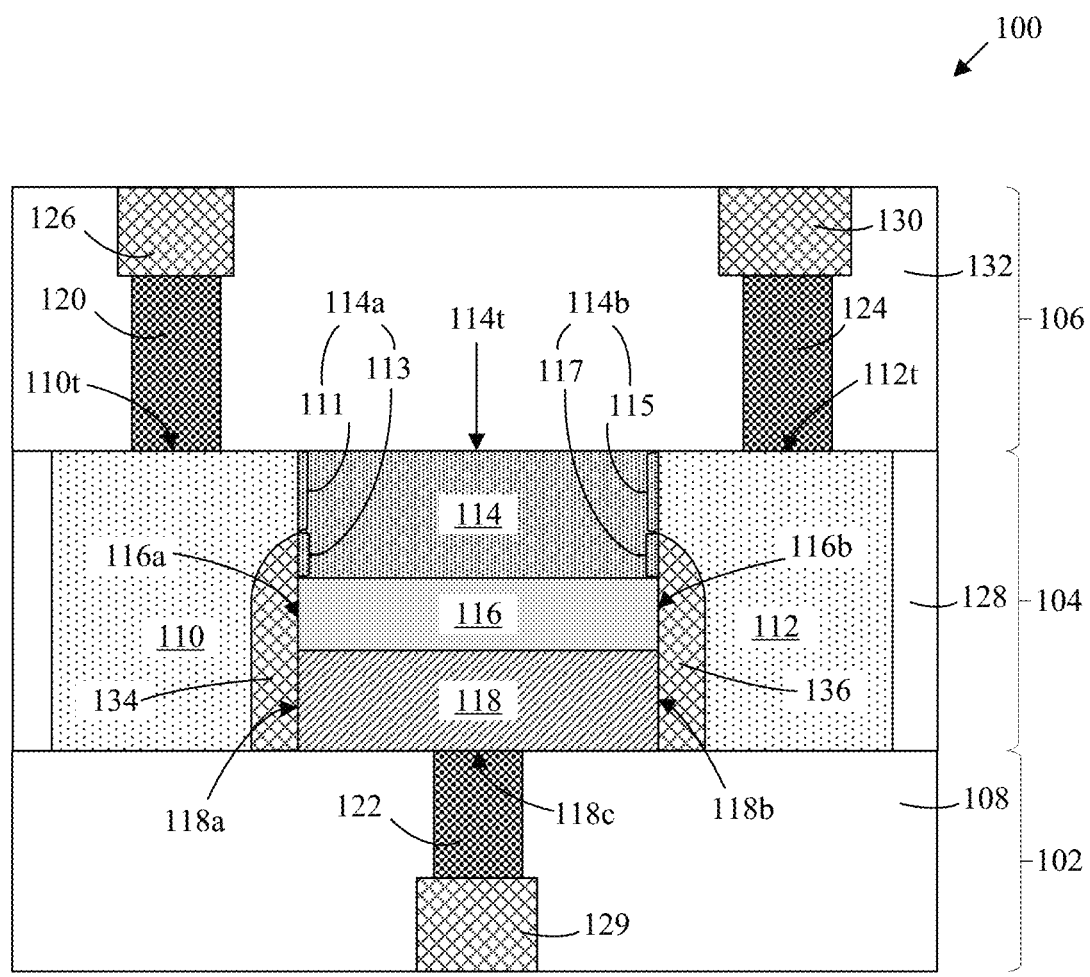
FIG. 1 and FIG. 2 are cross-sectional views of example memory structures.
Figure 2:
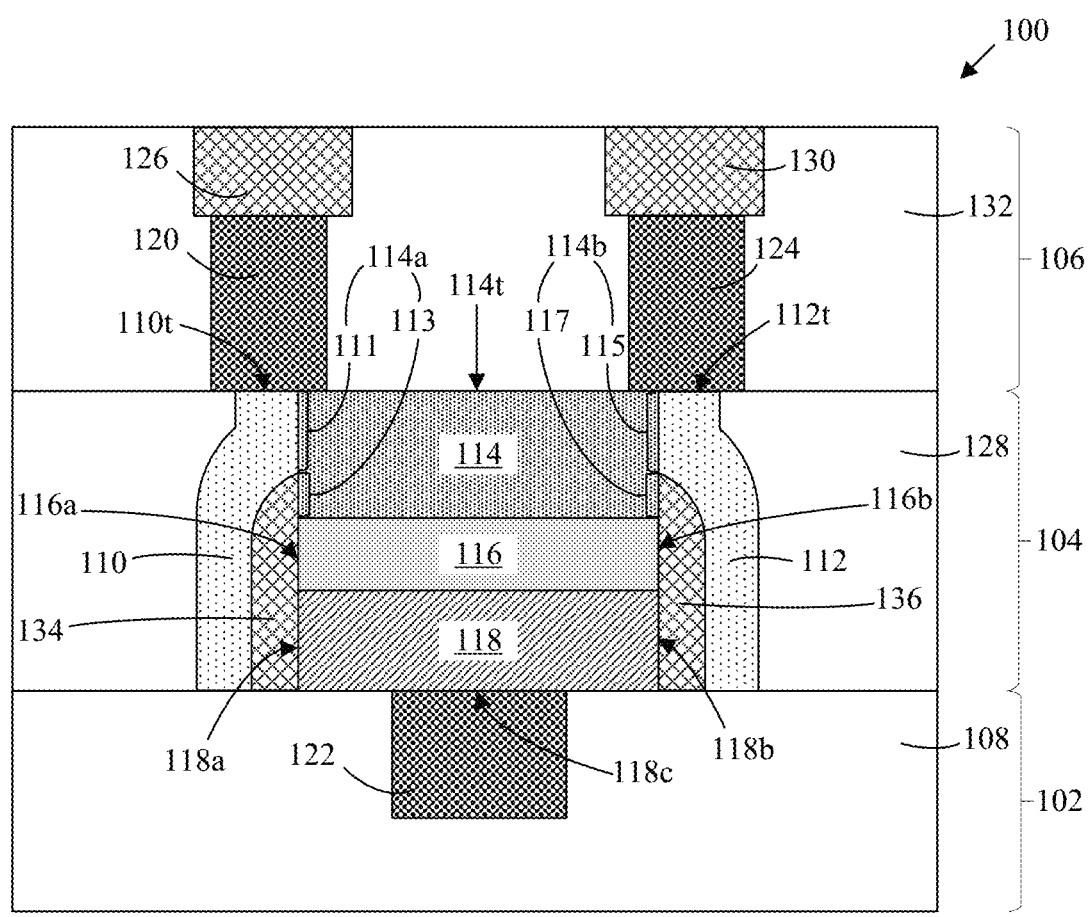

Referring to FIG. 1 and FIG. 2, the example memory structures 100 may include a source electrode 110, a drain electrode 112, a control electrode 118 laterally between the source electrode 110 and the drain electrode 112, a hole generating layer 116 above the control electrode 118, a dielectric channel layer 114 above the hole generating layer 116. The dielectric channel layer 114 may contact or directly contact the source electrode 110 and the drain electrode 112. In some implementations, the hole generating layer 116 may be on or directly on the control electrode 118, and the dielectric channel layer 114 may be on or directly on the hole generating layer 116. The source electrode 110, the drain electrode 112, the dielectric channel layer 114, the hole generating layer 116, and the control electrode 118 may provide a memory cell, or a single memory cell unit. The memory structures 100 described herein may be formed above a substrate (not shown).

The control electrode 118 may have a first side 118a and a second side 118b. The first side 118a of the control electrode 118 may be oppositely facing the second side 118b of the control electrode 118. The control electrode 118 may have a lower surface 118c. The lower surface 118c may adjoin the first side 118a and the second side 118b. The hole generating layer 116 may have a first side 116a and a second side 116b. A first spacer layer 134 may cover at least the first side 118a of the control electrode 118 and the first side 116a of the hole generating layer 116. A second spacer layer 136 may cover at least the second side 118b of the control electrode 118 and the second side 116b of the hole generating layer 116. The first spacer layer 134 and the second spacer layer 136 may isolate the source electrode 110 and the drain electrode 112 from the control electrode 118 and the hole generating layer 116. For example, the first spacer layer 134 may be on or directly on the first side 118a of the control electrode 118 and the first side 116a of the hole generating layer 116 while the second spacer layer 136 may be on or directly on the second side 118b of the control electrode 118 and the second side 116b of the hole generating layer 116.

The dielectric channel layer 114 may have a first side 114a and a second side 114b. The first side 114a may contact or directly contact the source electrode 110 and the second side 114b may contact or directly contact the drain electrode 112. The first side 114a of the dielectric channel layer 114 may have an upper portion 111 and a lower portion 113. The second side 114b of the dielectric channel layer 114 may have an upper portion 115 and a lower portion 117. The first spacer layer 134 may overlap with the lower portion 113 of the first side 114a of the dielectric channel layer 114. The second spacer layer 136 may overlap with the lower portion 117 of the second side 114b of the dielectric channel layer 114. For example, the first spacer layer 134 may be on or directly on the lower portion 113 of the first side 114a of the dielectric channel layer 114. The second spacer layer 136 may be on or directly on the lower portion 117 of the second side 114b of the dielectric channel layer 114. The source electrode 110 may contact or directly contact the upper portion 111 of the first side 114a of the dielectric channel layer 114. The drain electrode 112 may contact or directly contact the upper portion 115 of the second side 114b of the dielectric channel layer 114.

The source electrode 110 may have an upper surface 110t. The drain electrode 112 may have an upper surface 112t. The dielectric channel layer 114 may have an upper surface 114t. The upper surface 110t of the source electrode 110, the upper surface 112t of the drain electrode 112, and the upper surface 114t of the dielectric channel layer 114 may be substantially coplanar with each other. For example, the upper surface 114t of the dielectric channel layer 114 may be substantially coplanar with the upper surface 110t of the source electrode 110 and the upper surface 112t of the drain electrode 112.

Interconnect structures, such as vias, landing pads, and conductive lines, may be formed above or below the control electrode 118, the source electrode 110, and the drain electrode 112. These interconnect structures may provide routing or wiring of electrical signals and may connect various devices or components within an IC chip to perform desired functions. As shown, the exemplary memory structures 100 may further include a first interconnect structure 122 below the control electrode 118, a second interconnect structure 120 above the source electrode 110, and a third interconnect structure 124 above the drain electrode 112. A conductive line 126 may be on the second interconnect structure 120 and a conductive line 130 may be on the third interconnect structure 124. In some implementations, the first interconnect structure 122 may contact or directly contact the lower surface 118c of the control electrode 118. The second interconnect structure 120 may contact or directly contact the upper surface 110t of the source electrode 110. The third interconnect structure 124 may contact or directly contact the upper surface 112t of the drain electrode 112. In the example shown in FIG. 1, the first interconnect structure 122 may be a via. The first interconnect structure 122 may be coupled and disposed on a conductive line 129. In the example shown in FIG. 2, the first interconnect structure 122 may be a landing pad. Alternatively, the first interconnect structure 122 shown in FIG. 1 may be a landing pad, and the first interconnect structure 122 shown in FIG. 2 may be a via, in which the first interconnect structure 122 may be coupled and disposed on a conductive line.

In the example shown in FIG. 2, the second interconnect structure 120 may overlap with the source electrode 110 and the dielectric channel layer 114 such that the second interconnect structure 120 may contact or directly contact the upper surface 110t of the source electrode 110 and the upper surface 114t of the dielectric channel layer 114. The third interconnect structure 124 may overlap with the drain electrode 112 and the dielectric channel layer 114 such that the third interconnect structure 124 may contact or directly contact the upper surface 112t of the drain electrode 112 and the upper surface 114t of the dielectric channel layer 114. Alternatively, in the example shown in FIG. 1, the second interconnect structure 120 may only contact or directly contact the upper surface 110t of the source electrode 110, and the third interconnect structure 124 may only contact or directly contact the upper surface 112t of the drain electrode 112.

Advantageously, having the hole generating layer 116 above the control electrode 118 and the dielectric channel layer 114 above the hole generating layer 116 may enable the first interconnect structure 122 to be positioned below the control electrode 118 while the second interconnect structure 120 and the third interconnect structure 124 to be positioned above the source electrode. The first interconnect structure 122 may also be formed in a different dielectric region from the second interconnect structure 120 and the third interconnect structure 124. The lateral distance between the second interconnect structure 120 and the third interconnect structure 124 can be reduced since the first interconnect structure 122 connecting to the control electrode does not need to be arranged laterally between the second interconnect structure 120 and the third interconnect structure 124 and does not need to be in the same dielectric region and the second interconnect structure 120 and the third interconnect structure 124. The memory structures 100 described herein can achieve a smaller size when compared to other memory structures where an interconnect structure is arranged laterally between the second interconnect structure and the third interconnect structure 124.

The exemplary memory structures 100 may also include a first dielectric region 102, a second dielectric region 104 on or directly on the first dielectric region 102, and a third dielectric region 106 on or directly on the second dielectric region 104. The dielectric regions 102, 104, 106 may be a region formed by the middle of line (MOL) or back end of line (BEOL) processing of an IC chip. The dielectric regions 102, 104, 106 may include a metallization level. The first interconnect structure 122 may be in the first dielectric region 102. The source electrode 110, the drain electrode 112, the control electrode 118, the hole generating layer 116, the dielectric channel layer 114, the first spacer layer 134, and the second spacer layer 136 may be in the second dielectric region 104. The second interconnect structure 120, the third interconnect structure 124, and the conductive lines 126, 130 may be in the third dielectric region 106.

The source electrode 110, the drain electrode 112, and the control electrode 118 may include a metal. Examples of the metal for the source electrode 110, the drain electrode 112, and the control electrode 118 may include, but are not limited to, tungsten, molybdenum, vanadium, strontium, cobalt, tantalum, titanium, hafnium, copper, aluminum, or an alloy thereof. In an embodiment, the electrodes 110, 112, 118 may have the same material. In another embodiment, the source electrode 110, the drain electrode 112, and the control electrodes 118 have different materials from each other. In yet another embodiment, the source electrode 110 and the drain electrode 112 may have the same material while the control electrode 118 may have a different material from the source electrode 110 and the drain electrode 112.

The dielectric channel layer 114 may include an oxide. In some embodiments, the dielectric channel layer 114 may include an oxide of the metal in the source electrode 110 and the drain electrode 112. In other embodiments, the dielectric channel layer 114 may include an oxide of tungsten, molybdenum, vanadium, or strontium cobalt alloy. The hole generating layer 116 may include a material saturated with hydrogen. For example, the material may have a crystalline structure and have hydrogen gas intercalated at the interstitial defect sites in the material. The hole generating layer 116 may include a hydrogen doped dielectric material or a hydrogen doped metal. For example, the hole generating layer 116 may include hydrogen doped silicon dioxide ($SiO_2$—H), platinum hydride (Pt—H), or palladium hydride (Pd—H). The hole generating layer 116 may be capable of providing holes (i.e., positive charge carriers or protons) that migrate from the hole generating layer 116 towards the dielectric channel layer 114 under the influence of an electric field.

As an illustrative example, during the operation of the memory structures 100 shown in FIG. 1 and FIG. 2, a bias voltage may be applied to the control electrode 118 through the first interconnect structure 122. The number of holes migrated towards the dielectric channel layer 114 may be dependent on the magnitude and direction of the bias voltage. A current may be allowed to flow through the dielectric channel layer 114 and between the source electrode 110 and the drain electrode 112. The migration of holes in and out of the dielectric channel layer 114 may increase or decrease the conductance of the dielectric channel layer 114, thereby increasing or decreasing the current flow between the source electrode 110 and the drain electrode 112. Thus, the control of the bias voltage applied to the control electrode 118 may modulate the conductance of the dielectric channel layer 114.

The dielectric regions 102, 104, 106 may include dielectric materials 108, 128, 132, respectively. Examples of the dielectric materials 108, 128, 132 may include, but are not limited to, silicon dioxide ($SiO_2$), silicon oxynitride (SiON), silicon nitride ($Si_3N_4$), Nitrogen doped silicon carbide (SiCN), $SiC_xH_z$ (i.e., BLOK™), or $SiN_wC_xH_z$ (i.e., NBLoK™), wherein each of w, x, y, and z independently has a value greater than 0 and less than 0.75, tetraethyl orthosilicate (TEOS), or a material having a chemical composition of $SiC_xO_yH_z$, wherein x, y, and z are in stoichiometric ratio.

The spacer layers 134, 136 may include, but are not limited to, silicon dioxide ($SiO_2$), silicon oxynitride (SiON), silicon nitride ($Si_3N_4$), Nitrogen doped silicon carbide (SiCN), $SiC_xH_z$ (i.e., BLOK™), or $SiN_wC_xH_z$ (i.e., NBLoK™), wherein each of w, x, y, and z independently has a value greater than 0 and less than 0.75, tetraethyl orthosilicate (TEOS), or a material having a chemical composition of $SiC_xO_yH_z$, wherein x, y, and z are in stoichiometric ratio. The spacer layers 134, 136 may serve to prevent electrical shorts or migration of holes between the source and drain electrodes 110, 112 and the sides 116a, 116b of the hole generating layer 116 and the sides 118a, 118b of the control electrode 118, and thereby ensuring that the migration of holes occurs only between the horizontal segment 116c of the hole generating layer 116 and the horizontal segment 114c of the dielectric channel layer 114.

FIGS. 3 through 11 show structures at successive fabrication stages of a processing method for fabricating an exemplary memory structure shown in FIG. 1.

As used herein, "deposition techniques" refer to the process of applying a material over another material (or the substrate). Exemplary techniques for deposition include, but are not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD).

Additionally, "patterning techniques" include deposition of material or photoresist, patterning, exposure, development, etching, cleaning, and/or removal of the material or photoresist as required in forming a described pattern, structure, or opening. Examples of techniques for patterning include, but are not limited to, wet etch lithographic processes, dry etch lithographic processes, or direct patterning processes. Such techniques may use mask sets and mask layers.

Figure 3:
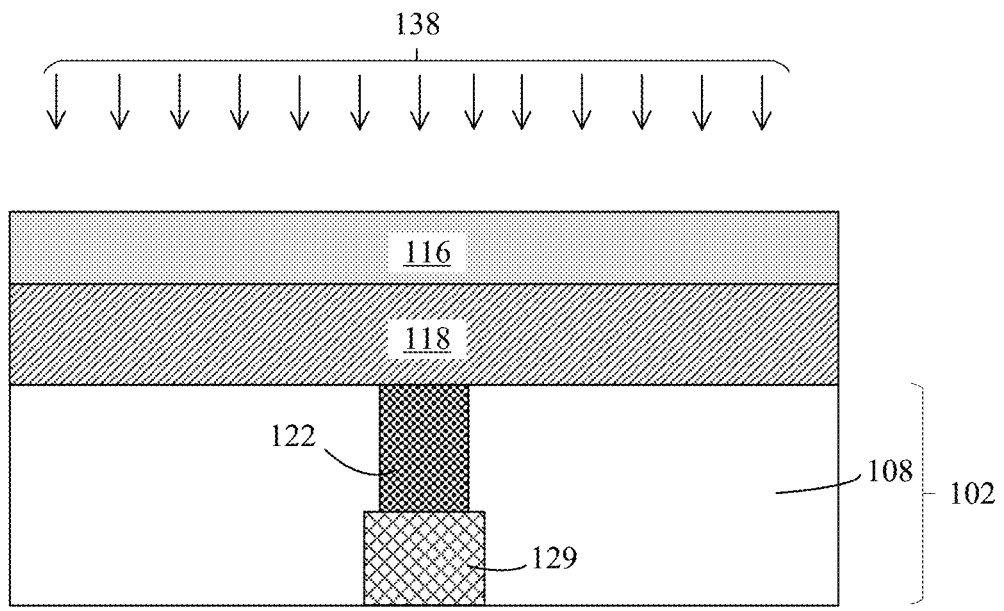
FIG. 3 through FIG. 11 are cross-sectional views depicting structures at successive fabrication stages of a processing method for fabricating an exemplary memory structure shown in FIG. 1.

Referring to FIG. 3, a first dielectric region 102 may be formed over a substrate (not shown). The first dielectric region 102 may include a first interconnect structure 122 formed in a dielectric material 108. A control electrode 118 may be formed on the dielectric material 108 and the first interconnect structure 122, for example, using deposition techniques. A hole generating layer 116 may be formed on the control electrode 118, for example, using deposition techniques. In an example, the hole generating layer 116 may be formed by depositing a silicon dioxide layer. The silicon dioxide layer may be injected, doped, or sputtered by a forming gas 138, such as hydrogen gas. In another example, the hole generating layer 116 may be formed by depositing platinum or palladium. The deposited platinum or palladium may be injected, doped, or sputtered by the forming gas 138 such that the platinum or palladium is saturated with the forming gas.

Figure 4:
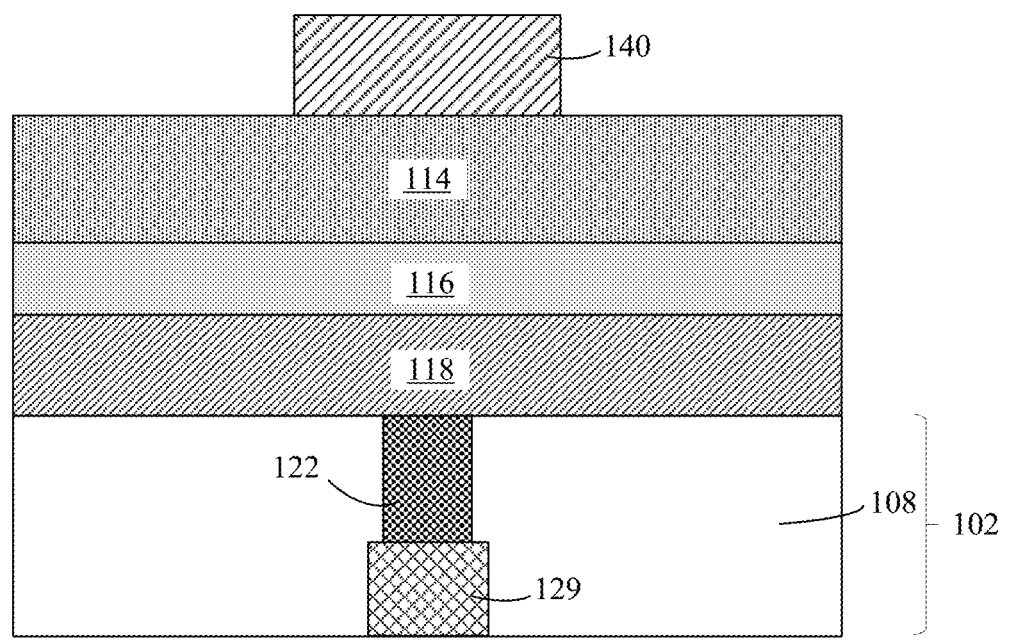
Figure 5:
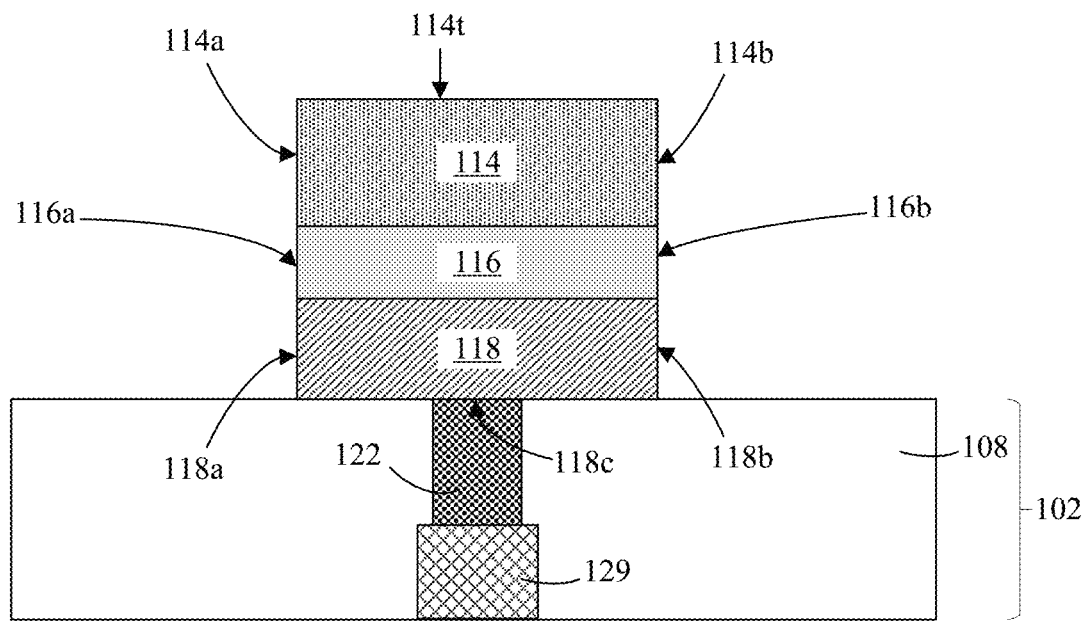

Referring to FIG. 4, a dielectric channel layer 114 may be formed on the hole generating layer 116 using deposition techniques. A mask layer 140 may be formed on the dielectric channel layer 114 and then patterned using patterning techniques. The mask layer 140 may be used for the subsequent patterning of the control electrode 118, the hole generating layer 116, and the dielectric channel layer 114. Referring to FIG. 5, the control electrode 118, the hole generating layer 116, and the dielectric channel layer 114 may be patterned using patterning techniques so that the patterned control electrode 118, hole generating layer 116, and dielectric channel layer 114 are aligned vertically over the first interconnect structure 122. The control electrode 118 may be patterned to form sides 118a, 118b, the hole generating layer 116 may be patterned to form sides 116a, 116b, and the dielectric channel layer 114 may be patterned to form sides 114a, 114b. The dielectric channel layer 114 may also have an upper surface 114t. The control electrode 118 may be patterned such that it has a lower surface 118c that contacts or directly contacts the first interconnect structure 122.

Figure 6:
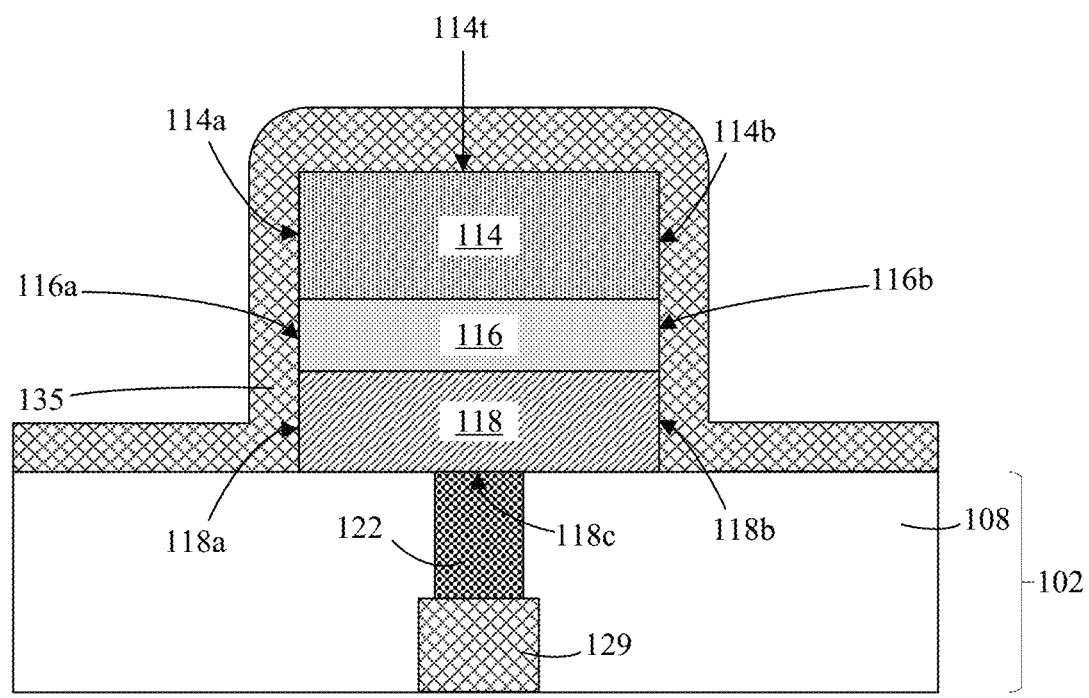

Referring to FIG. 6, a spacer material layer 135 may be formed using a deposition technique, and preferably, using conformal deposition (e.g., ALD) such that the spacer material layer 135 covers the sides 118a, 118b of the control electrode, the sides 116a, 116b of the hole generating layer 116, and the sides 114a, 114b and the upper surface 114t of the dielectric channel layer 114. The spacer material layer 135 may also cover the dielectric material 108 in the first dielectric region 102.

Figure 7:
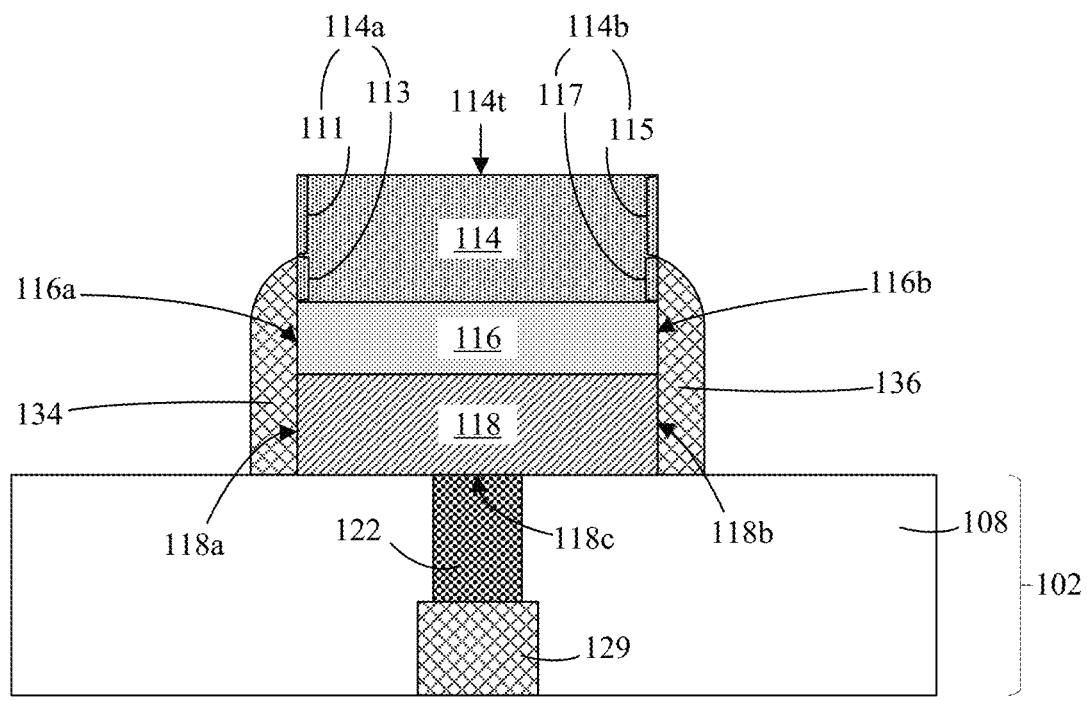

Referring to FIG. 7, the spacer material layer 135 may be etched using a directional etching, such as anisotropic etching, to form a first spacer layer 134 and a second spacer layer 136. The etching of the spacer material layer 135 may be controlled such that the first spacer layer 134 and the second spacer layer 136 cover the sides 118a, 118b of the control electrode and the sides 116a, 116b of the hole generating layer 116. Additionally, a lower portion 113 of side 114a and a lower portion 117 of side 114b may be covered by the first spacer layer 134 and the second spacer layer 136, respectively, while an upper portion 111 of side 114a and an upper portion 115 of side 114b may be exposed and uncovered by the first spacer layer 134 and the second spacer layer 136, respectively. The etching of the spacer material layer 135 may also expose the upper surface 114t of the dielectric channel layer 114 and portions of the dielectric material 108 in the first dielectric region 102.

Figure 8:
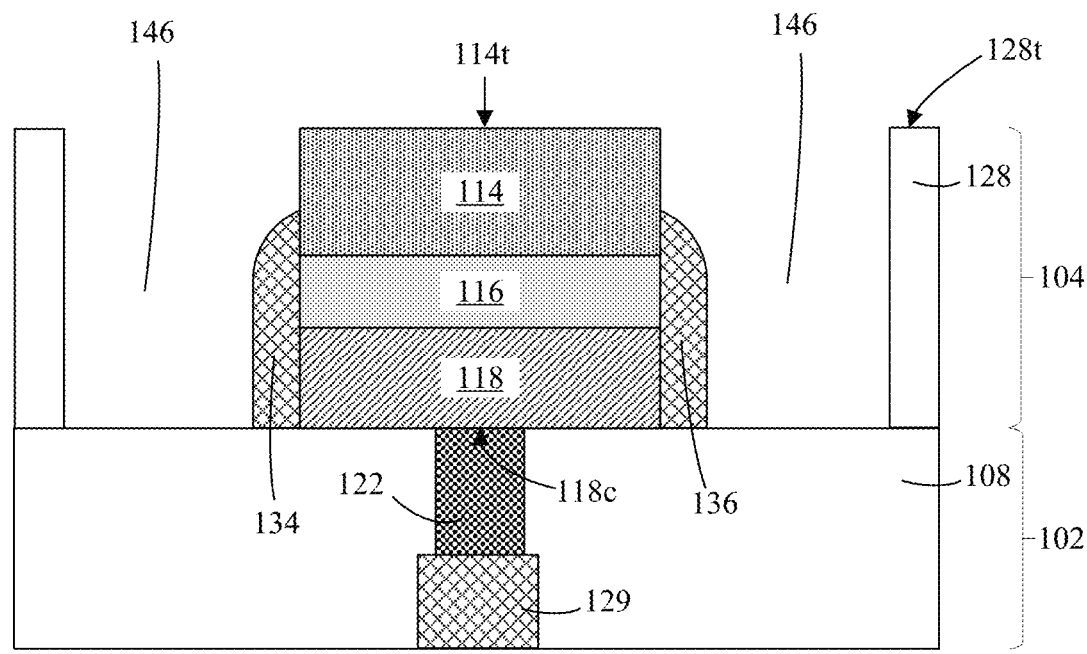

Referring to FIG. 8, a second dielectric region 104 may be formed on the first dielectric region 102. The second dielectric region 104 may include a dielectric material 128 formed on the dielectric material 108 using deposition techniques. The dielectric material 128 may have an upper surface 128t. The dielectric material 128 may be patterned using patterning techniques to form source/drain openings 146 in the second dielectric region 104. The source/drain openings 146 may be defined in the dielectric material 128.

Figure 9:
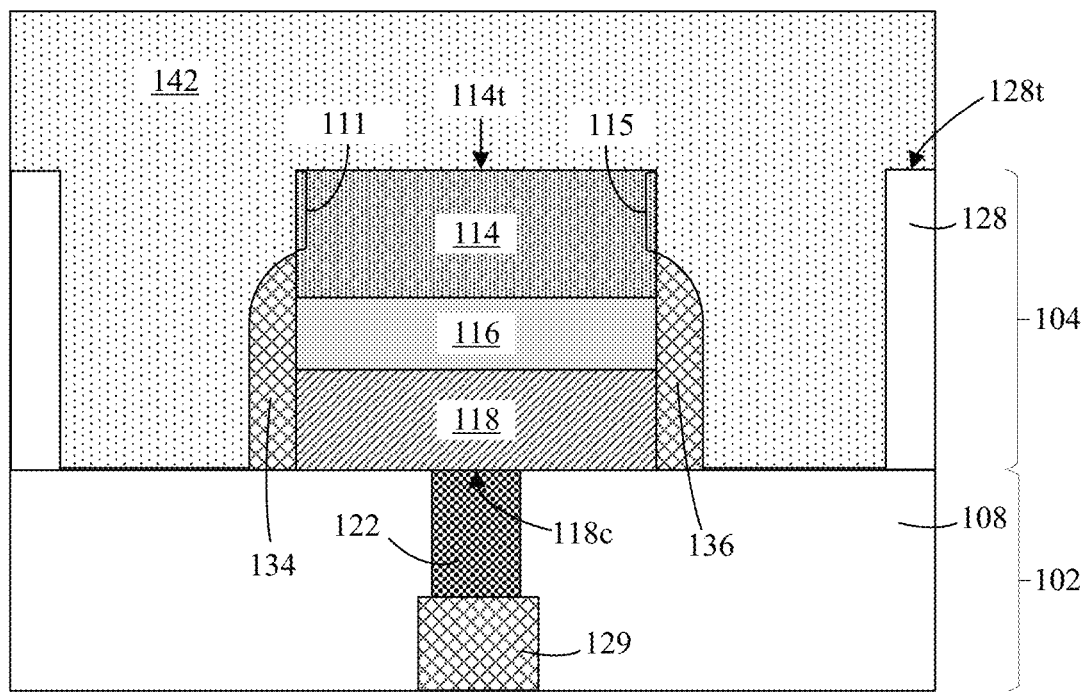

Referring to FIG. 9, a metal layer 142 may be formed in the source/drain openings 146. The metal layer 142 may also be formed over the dielectric material 108, the spacer layers 134, 136, the dielectric material 128, and the dielectric channel layer 114 using deposition techniques. The metal layer 142 may be deposited in the source/drain openings 146 such that the metal layer 142 is on the upper portion 111 of the side 114a of the dielectric channel layer 114, the upper portion 115 of the side 114b of the dielectric channel layer 114. The metal layer 142 may also extend outside of the source/drain openings 146 and overlie the upper surface 128t of the dielectric material 128 and the upper surface 114t of the dielectric channel layer 114.

Figure 10:
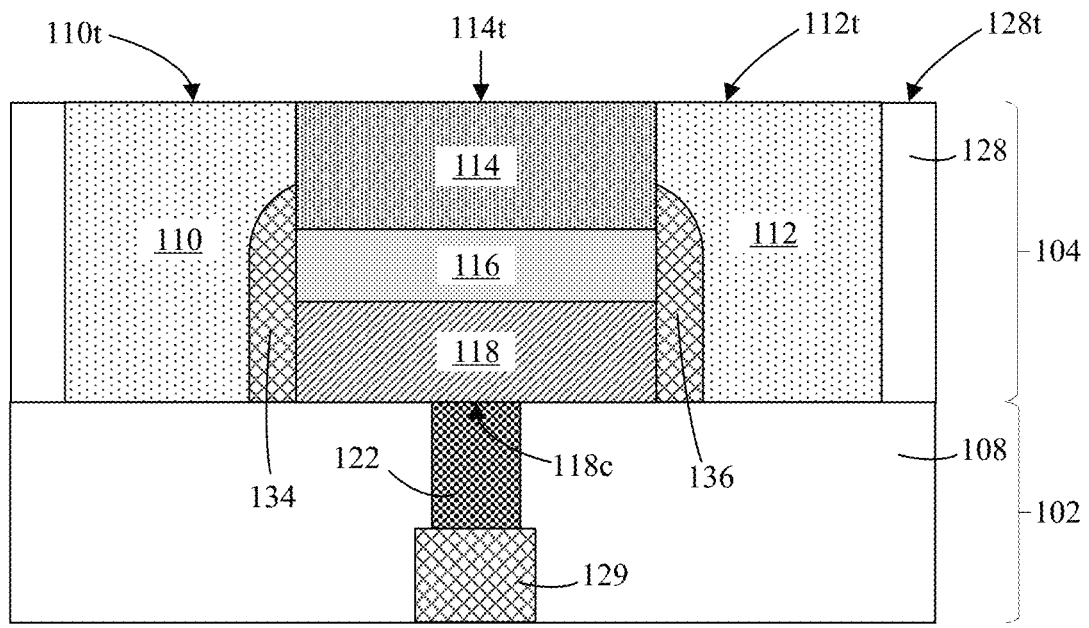

Referring to FIG. 10, a chemical mechanical planarization (CMP) process may be performed on the structure shown in FIG. 9 to remove portions of the metal layer 142 and expose the upper surface 114t of the dielectric channel layer 114 and the upper surface 128t of the dielectric material 128. A source electrode 110 and a drain electrode 112 may be formed after the CMP process. The source electrode 110 may have an upper surface 110t and the drain electrode 112 may have an upper surface 112t. The CMP process may ensure that the upper surface 110t of the source electrode 110, and the upper surface 112t of the drain electrode 112 are substantially coplanar with the upper surface 114t of the dielectric channel layer 114 and the upper surface 128t of the dielectric material 128. In an implementation, the source electrode 110 and the drain electrode 112 may include the same metal. The second dielectric region 104 may include the source electrode 110, the drain electrode 112, the spacer layers 134, 136, the control electrode 118, the hole generating layer 116, and the dielectric channel layer 114, in addition to the dielectric material 128.

Figure 11:
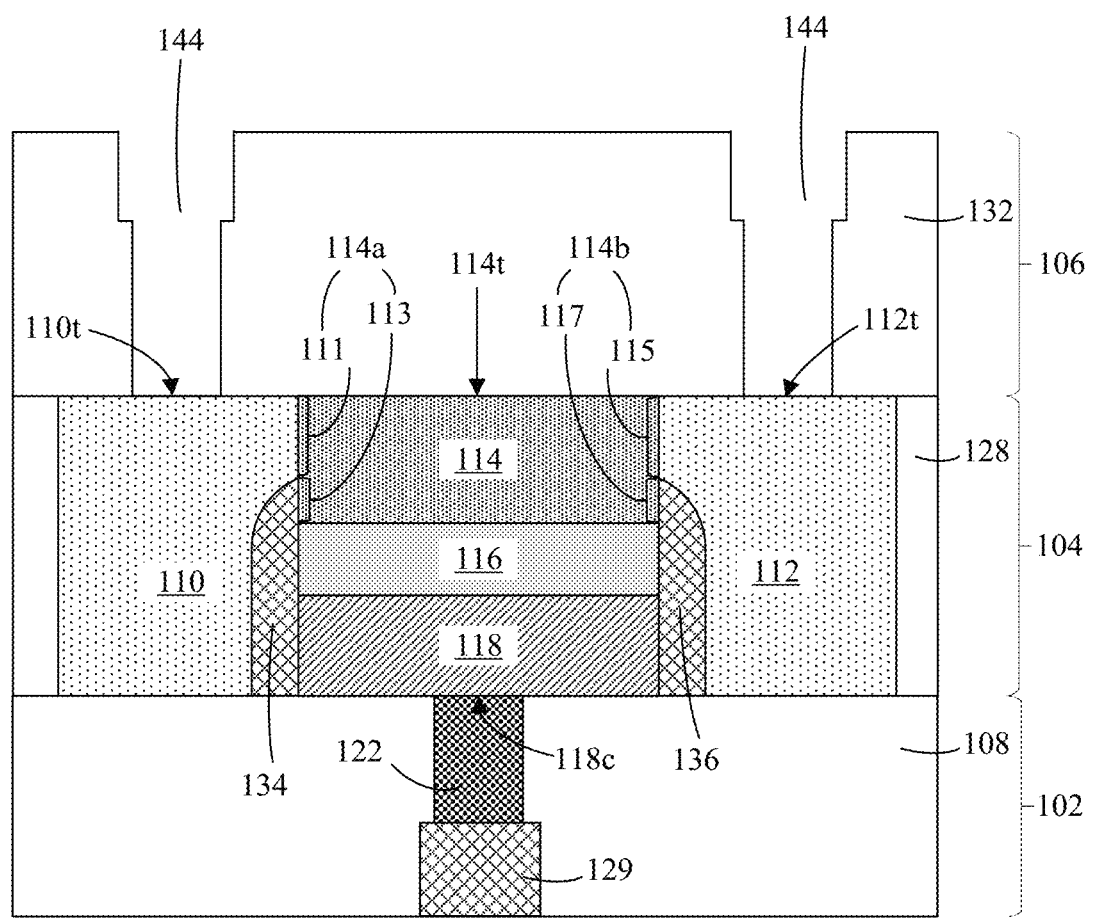

Referring to FIG. 11, a third dielectric region 106 may be formed on the second dielectric region 104. The third dielectric region 106 may include a dielectric material 132 formed on the upper surface 110t of the source electrode 110, the upper surface 112t of the drain electrode, the upper surface 114t of the dielectric channel layer 114, and the dielectric material 128 using the deposition techniques described herein. Interconnect openings 144 may be formed in the dielectric material 132 using patterning techniques. Interconnect structures, as described in FIG. 1, may be formed in the interconnect openings 144, for example, by forming a metal, such as cobalt (Co), copper (Cu), aluminum (Al), or an alloy thereof, in the interconnect openings 144. Other suitable types of metals or alloys may also be useful. The interconnect openings 144 may be formed such that they are aligned vertically above the upper surface 110t of the source electrode 110 and the upper surface 112t of the drain electrode 112.

FIGS. 3 through 7 and FIGS. 12 through 14 show structures at successive fabrication stages of a processing method for fabricating an exemplary memory structure shown in FIG. 2.

Figure 12:
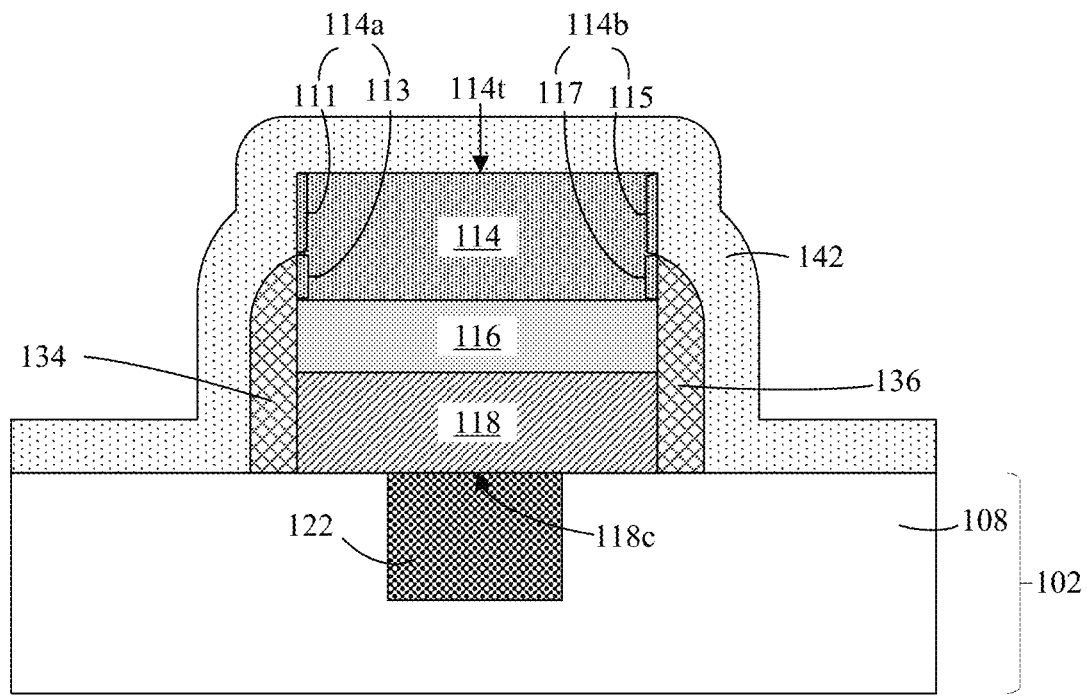

Referring to FIG. 12 (FIG. 12 continues from the structure shown in FIG. 7), a metal layer 142 may be formed over the dielectric material 108, the spacer layers 134, 136, and the dielectric channel layer 114 using deposition techniques. The metal layer 142 may be deposited on the upper portion 111 of the side 114a of the dielectric channel layer 114, the upper portion 115 of the side 114b of the dielectric channel layer 114, and the upper surface 114t of the dielectric channel layer 114. The deposition of the metal layer 142 in FIG. 12 may deposit lesser material as compared to the deposition of the metal layer 142 in FIG. 9.

Figure 13:
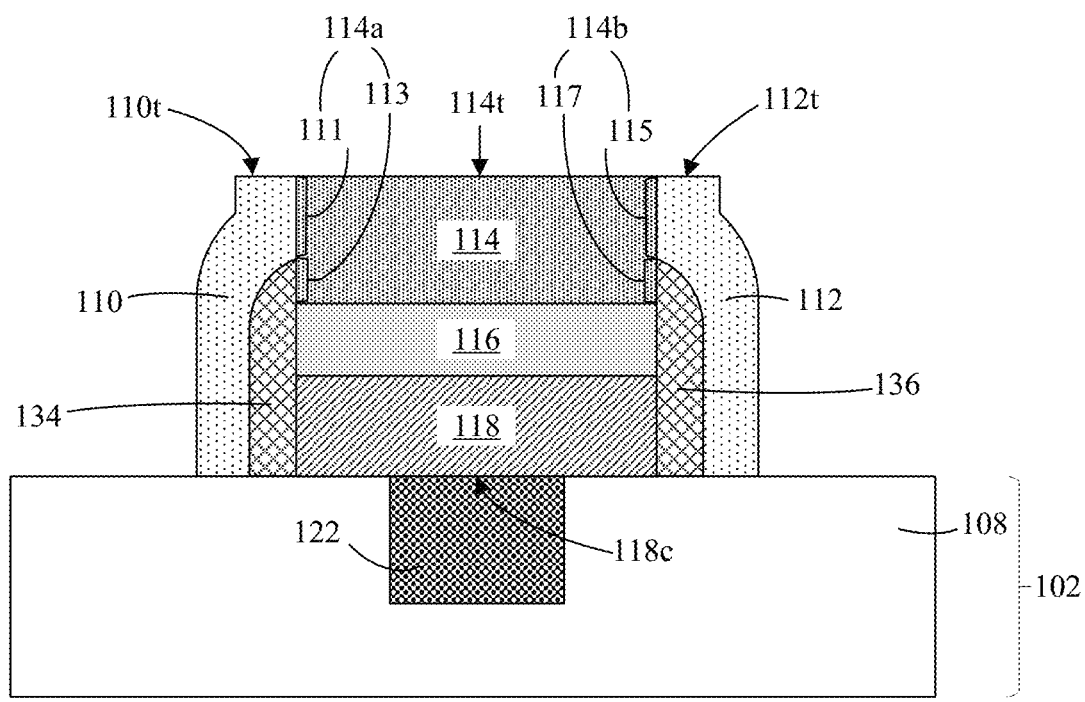

Referring to FIG. 13, the metal layer 142 may be etched using a directional etching such as anisotropic etching. For example, horizontal segments of the metal layer 142 covering the dielectric material 108 and the upper surface 114t of the dielectric channel layer 114 may be removed while vertical segments of the metal layer 142 covering the spacer layers 134, 136 and the upper portions 111, 115 of the sides 114a, 114b of the dielectric channel layer 114 are retained. A source electrode 110 and a drain electrode 112 may be formed after the etching of the metal layer 142. The source electrode 110 may have an upper surface 110t and the drain electrode 112 may have an upper surface 112t. In an implementation, the source electrode 110 and the drain electrode 112 may include the same metal.

Figure 14:
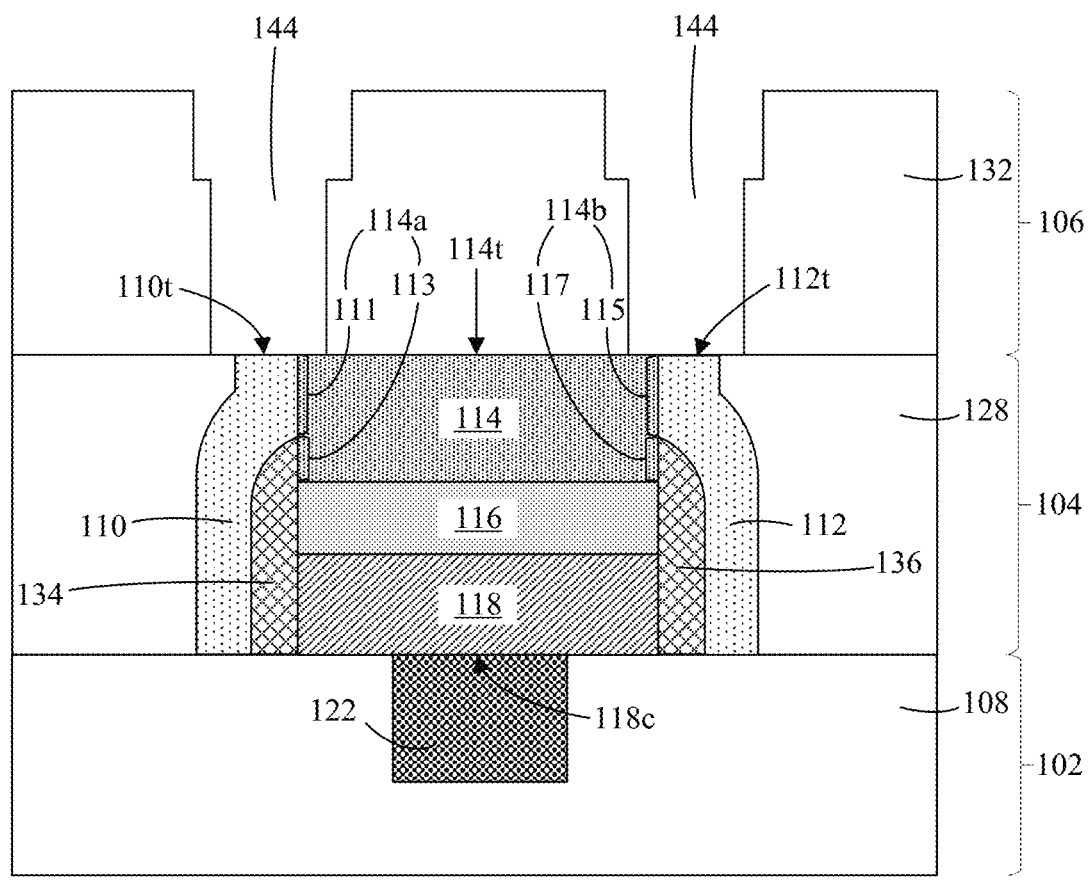

Referring to FIG. 14, a second dielectric region 104 may be formed on the first dielectric region 102. The second dielectric region 104 may include a dielectric material 128 formed laterally adjacent to the source electrode 110 and the drain electrode 112 and on the dielectric material 108 using deposition techniques. Although not shown, the dielectric material 128 may be deposited over the upper surface 114t of the dielectric channel layer 114, the upper surface 110t of the source electrode 110, and the upper surface 112t of the drain electrode 112. A CMP process may be performed on the deposited dielectric material 128 to expose the upper surface 114t of the dielectric channel layer 114, the upper surface 110t of the source electrode 110, and the upper surface 112t of the drain electrode 112. The CMP process may also ensure that the upper surface 110t of the source electrode 110, the upper surface 112t of the drain electrode 112 are substantially coplanar with the upper surface 114t of the dielectric channel layer 114. The second dielectric region 104 may include the source electrode 110, the drain electrode 112, the spacer layers 134, 136, the control electrode 118, the hole generating layer 116, and the dielectric channel layer 114.

A third dielectric region 106 may be formed on the second dielectric region 104. The third dielectric region 106 may include a dielectric material 132 formed on the upper surface 110t of the source electrode 110, the upper surface 112t of the drain electrode, the upper surface 114t of the dielectric channel layer 114, and the dielectric material 128 using the deposition techniques described herein. Interconnect openings 144 may be formed in the dielectric material 132 using patterning techniques. Interconnect structures, as described in FIG. 1, may be formed in the interconnect openings 144, for example, by forming a metal, such as cobalt (Co), copper (Cu), aluminum (Al), or an alloy thereof, in the interconnect openings 144. Other suitable types of metals or alloys may also be useful. The interconnect openings 144 may be formed such that they are aligned vertically above the upper surface 110t of the source electrode 110 and the upper surface 112t of the drain electrode 112. The vertical alignment of the interconnect openings 144 may also overlap with the source electrode 110 and the dielectric channel layer 114 and the drain electrode 112 and the dielectric channel layer 114.

Throughout this disclosure, it is to be understood that if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description. Additionally, the various tasks and processes described herein may be incorporated into a more comprehensive procedure or process having additional functionality not described in detail herein.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

As will be readily apparent to those skilled in the art upon a complete reading of the present application, the disclosed semiconductor devices and methods of forming the same may be employed in manufacturing a variety of different integrated circuit products, including, but not limited to, memory cells, NV memory devices, FinFET transistor devices, CMOS devices, etc.

What is claimed is:

1. A memory structure comprising:
   a source electrode;
   a drain electrode;
   a control electrode laterally between the source electrode and the drain electrode, the control electrode having a first side and a second side;
   a hole generating layer above the control electrode;
   a dielectric channel layer above the hole generating layer, the dielectric channel layer contacts the source electrode and the drain electrode;
   a first spacer layer on the first side of the control electrode; and
   a second spacer layer on the second side of the control electrode, wherein the first spacer layer and the second spacer layer isolate the source electrode and the drain electrode from the control electrode and the hole generating layer.

2. The memory structure of claim 1, wherein the dielectric channel layer has a first side and a second side, the first side contacts the source electrode, and the second side contacts the drain electrode.

3. The memory structure of claim 2, further comprising:
   a first interconnect structure below the control electrode;

a second interconnect structure above the source electrode; and a third interconnect structure above the drain electrode.

4. The memory structure of claim 2, wherein the first spacer layer overlaps with a lower portion of the first side of the dielectric channel layer, and the second spacer layer overlaps with a lower portion of the second side of the dielectric channel layer.

5. The memory structure of claim 4, wherein the source electrode contacts an upper portion of the first side of the dielectric channel layer and the drain electrode contacts an upper portion of the second side of the dielectric channel layer.

6. The memory structure of claim 3, wherein the second interconnect structure overlaps with the source electrode and the dielectric channel layer, and the third interconnect structure overlaps with the drain electrode and the dielectric channel layer.

7. The memory structure of claim 6, further comprising:
 a first dielectric region, wherein the first interconnect structure is in the first dielectric region; and
 a second dielectric region on the first dielectric region, wherein the source electrode, the drain electrode, the control electrode, the dielectric channel layer, the hole generating layer, the first spacer layer, and the second spacer layer are in the second dielectric region.

8. The memory structure of claim 7, further comprising a third dielectric region on the second dielectric region, wherein the second interconnect structure and the third interconnect structure are in the third dielectric region.

9. The memory structure of claim 1, wherein the source electrode has an upper surface, the drain electrode has an upper surface, and the dielectric channel layer has an upper surface, and wherein the upper surface of the source electrode and the upper surface of the drain electrode are substantially coplanar with the upper surface of the dielectric channel layer.

10. The memory structure of claim 1, wherein the hole generating layer includes a hydrogen doped dielectric material or a hydrogen doped metal.

11. The memory structure of claim 10, wherein the hole generating layer includes hydrogen doped silicon dioxide, platinum hydride, or palladium hydride.

12. The memory structure of claim 1, wherein the dielectric channel layer includes an oxide of tungsten, molybdenum, vanadium, or strontium cobalt alloy.

13. A memory structure comprising:
 a source electrode having an upper surface;
 a drain electrode having an upper surface;
 a control electrode laterally between the source electrode and the drain electrode, the control electrode has a lower surface, a first side, and a second side;
 a hole generating layer on the control electrode;
 a dielectric channel layer on the hole generating layer, the dielectric channel layer having a first side and a second side, wherein the first side contacts the source electrode and the second side contacts the drain electrode;
 a first spacer layer on the first side of the control electrode;
 a second spacer layer on the second side of the control electrode, wherein the first spacer layer and the second spacer layer isolate the source electrode and the drain electrode from the control electrode and the hole generating layer;
 a first interconnect structure below and in contact with the lower surface of the control electrode;
 a second interconnect structure above and in contact with the upper surface of the source electrode; and
 a third interconnect structure above and in contact with the upper surface of the drain electrode.

14. The memory structure of claim 13, wherein the upper surface of the source electrode and the upper surface of the drain electrode are substantially coplanar with the upper surface of the dielectric channel layer.

15. The memory structure of claim 13, wherein the first spacer layer overlaps with a lower portion of the first side of the dielectric channel layer, and the second spacer layer overlaps with a lower portion of the second side of the dielectric channel layer.

16. The memory structure of claim 15, wherein the source electrode contacts an upper portion of the first side of the dielectric channel layer and the drain electrode contacts an upper portion of the second side of the dielectric channel layer.

17. The memory structure of claim 16, wherein the second interconnect structure overlaps with the source electrode and the dielectric channel layer, and the third interconnect structure overlaps with the drain electrode and the dielectric channel layer.

18. The memory structure of claim 13, wherein the hole generating layer includes a hydrogen doped dielectric material or a hydrogen doped metal.

19. The memory structure of claim 18, wherein the hole generating layer includes hydrogen doped silicon dioxide, platinum hydride, or palladium hydride.

20. A memory structure comprising:
 a first dielectric region;
 a first interconnect structure in the first dielectric region;
 a second dielectric region on the first dielectric region;
 a source electrode in the second dielectric region;
 a drain electrode in the second dielectric region;
 a control electrode in the second dielectric region, the control electrode is laterally between the source electrode and the drain electrode, the control electrode has a lower surface, a first side, and a second side, wherein the lower surface of the control electrode is on the first interconnect structure;
 a hole generating layer in the second dielectric region, the hole generating layer is on the control electrode;
 a dielectric channel layer in the second dielectric region, the dielectric channel layer is on the hole generating layer, the dielectric channel layer having a first side and a second side, wherein the first side contacts the source electrode and the second side contacts the drain electrode;
 a first spacer layer in the second dielectric region, the first spacer layer is on the first side of the control electrode;
 a second spacer layer in the second dielectric region, the second spacer layer is on the second side of the control electrode, wherein the first spacer layer and the second spacer layer isolate the source electrode and the drain electrode from the control electrode and the hole generating layer;
 a third dielectric region on the second dielectric region;
 a second interconnect structure in the third dielectric region, the second interconnect structure is on the source electrode; and
 a third interconnect structure in the third dielectric region, the third interconnect structure is on the drain electrode.

* * * * *